United States Patent
Hsiao et al.

(10) Patent No.: US 10,763,884 B2
(45) Date of Patent: Sep. 1, 2020

(54) HIGH LINEARITY DIGITAL-TO-ANALOG CONVERTER WITH ISI-SUPPRESSING METHOD

(71) Applicant: MEDIATEK INC., Hsin-Chu (TW)

(72) Inventors: Chuan-Hung Hsiao, Hsin-Chu (TW);
Sung-Han Wen, Hsin-Chu (TW);
Kuan-Ta Chen, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/515,056

(22) Filed: Jul. 18, 2019

(65) Prior Publication Data
US 2020/0028519 A1 Jan. 23, 2020

Related U.S. Application Data

(60) Provisional application No. 62/701,885, filed on Jul. 23, 2018.

(51) Int. Cl.
*H03M 1/68* (2006.01)
*H03M 1/06* (2006.01)
*H03M 7/36* (2006.01)

(52) U.S. Cl.
CPC .......... *H03M 1/687* (2013.01); *H03M 1/067* (2013.01); *H03M 1/0665* (2013.01);
(Continued)

(58) Field of Classification Search
CPC .... H03M 1/687; H03M 1/067; H03M 7/3026; H03M 1/68; H03M 1/0668; H03M 1/0665
(Continued)

(56) References Cited

U.S. PATENT DOCUMENTS 7,123,178 B2  10/2006  Ishizuka
7,268,716 B2 *  9/2007  Sakiyama ............. H03M 3/366
                                                    341/143
(Continued)

FOREIGN PATENT DOCUMENTS

EP     3 288 186 A1   2/2018
TW     201436474 A    9/2014
TW     I600281 B      9/2017

OTHER PUBLICATIONS van Tuijl, A 128fs Multi-Bit Sigma-Delta CMOS Audio DAC with Real-Time DEM and 115dB SFDR, ISSCC 2004/Session 20/Digital-To-Analog Converters/20.5.
(Continued)

*Primary Examiner* — Khai M Nguyen
(74) *Attorney, Agent, or Firm* — Winston Hsu

(57) ABSTRACT

A digital-to-analog conversion circuit is used for converting a first digital input into a first analog output, and includes a segmentation circuit, a plurality of multi-bit dynamic element matching digital-to-analog converters (DEM DACs), and a combination circuit. The segmentation circuit applies segmentation to the first digital input to generate a plurality of code segments. The multi-bit DEM DACs convert the code segments into a plurality of DAC outputs, respectively, wherein the multi-bit DEM DACs include at least a first multi-bit DEM DAC and a second multi-bit DEM DAC, and the first multi-bit DEM DAC and the second multi-bit DEM DAC employ different DEM techniques. The combination circuit combines the DAC outputs to generate the first analog output.

20 Claims, 14 Drawing Sheets

(52) U.S. Cl.
CPC ............ *H03M 1/0668* (2013.01); *H03M 1/68* (2013.01); *H03M 7/3026* (2013.01)

(58) Field of Classification Search
USPC .................................................. 341/143–145
See application file for complete search history.

(56) References Cited

U.S. PATENT DOCUMENTS

| | | | |
|---|---|---|---|
| 7,538,707 B2 * | 5/2009 | Sakurai ............... | H03M 1/0665 341/144 |
| 7,561,088 B1 * | 7/2009 | Ferguson ............ | H03M 1/0665 341/143 |
| 9,735,799 B1 * | 8/2017 | Nguyen ................. | H03M 1/06 |
| 2006/0007027 A1 | 1/2006 | Ishizuka | |
| 2009/0224953 A1 | 9/2009 | Seo | |
| 2013/0147533 A1 | 6/2013 | Ding | |
| 2018/0145697 A1 | 5/2018 | Crespi | |

OTHER PUBLICATIONS

Robert Adams et al., A 113-dB SNR Oversampling DAC with Segmented Noise-Shaped Scrambling, IEEE Journal of Solid-State Circuits, vol. 33, No. 12, Dec. 1998, pp. 1871-1878, IEEE, XP055284296.

* cited by examiner

HIGH LINEARITY DIGITAL-TO-ANALOG CONVERTER WITH ISI-SUPPRESSING METHOD

CROSS REFERENCE TO RELATED APPLICATIONS

This application claims the benefit of U.S. provisional application No. 62/701,885, filed on Jul. 23, 2018 and incorporated herein by reference.

BACKGROUND

The present invention relates to converting a digital input into an analog output, and more particularly, to a high linearity digital-to-analog converter with an ISI-suppressing method.

A digital-to-analog converter (DAC) is used to convert a digital input into an analog output. In thermometer coding multi-bit DAC designs, the digital input is mapped to multiple 1-bit values each driving a 1-bit DAC, and DAC outputs of the 1-bit DACs are combined to form the analog output. Ideally, each 1-bit DAC generates a two-level analog output waveform that instantaneously switches between its two levels when its input bit value changes from 0 to 1 (or from 1 to 0). In practice, non-ideal circuit behavior causes multi-bit DACs to deviate from the ideal DAC behavior. Particularly significant types of non-ideal circuit behavior are element mismatches and nonlinear inter-symbol interference (ISI). Mismatches among elements that make up these 1-bit DACs inevitably occur during fabrication and cause error in the multi-bit DAC output. Additionally, practical 1-bit DACs do not transit instantaneously between their two levels, thus introducing signal-dependent transient errors at rising edges and falling edges. In many cases, a 1-bit DAC's transient error depends on one or more of its prior input bit values as well as its current input bit value. Such rising and falling transient errors are said to contain ISI.

Thus, there is a need for an innovative DAC design that is capable of reducing distortion caused by DAC nonlinearity.

SUMMARY

One of the objectives of the present invention is to provide a high linearity digital-to-analog converter with an ISI-suppressing method. For example, embodiments of the present invention provide a digital-to-analog conversion circuit using segmentation and different dynamic element matching techniques and an associated method.

According to a first aspect of the present invention, an exemplary digital-to-analog conversion circuit for converting a first digital input into a first analog output is disclosed. The exemplary digital-to-analog conversion circuit includes a segmentation circuit, a plurality of multi-bit dynamic element matching digital-to-analog converters (DEM DACs), and a combination circuit. The segmentation circuit is arranged to apply segmentation to the first digital input to generate a plurality of code segments. The multi-bit DEM DACs are arranged to convert the code segments into a plurality of DAC outputs, respectively, wherein the multi-bit DEM DACs comprise at least a first multi-bit DEM DAC and a second multi-bit DEM DAC, and the first multi-bit DEM DAC and the second multi-bit DEM DAC employ different DEM techniques. The combination circuit is arranged to combine the DAC outputs to generate the first analog output.

According to a second aspect of the present invention, an exemplary digital-to-analog conversion method for converting a first digital input into a first analog output is disclosed. The exemplary digital-to-analog conversion method includes: applying segmentation to the first digital input to generate a plurality of code segments; converting the code segments, by a plurality of multi-bit dynamic element matching digital-to-analog converters (DEM DACs), into a plurality of DAC outputs, respectively, wherein the multi-bit DEM DACs comprise at least a first multi-bit DEM DAC and a second multi-bit DEM DAC, and the first multi-bit DEM DAC and the second multi-bit DEM DAC employ different DEM techniques; and combining the DAC outputs to generate the first analog output.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram illustrating a DWA operation performed at the DEM circuit shown in FIG. 2.

FIG. 12 is a diagram illustrating a second modified rotated PWM operation performed at the PWM code rotator shown in FIG. 4 according to an embodiment of the present invention.

FIG. 13 is a diagram illustrating a third modified rotated PWM operation performed at the PWM code rotator shown in FIG. 4 according to an embodiment of the present invention.

FIG. 14 is a diagram illustrating a fourth modified rotated PWM operation performed at the PWM code rotator shown in FIG. 4 according to an embodiment of the present invention.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
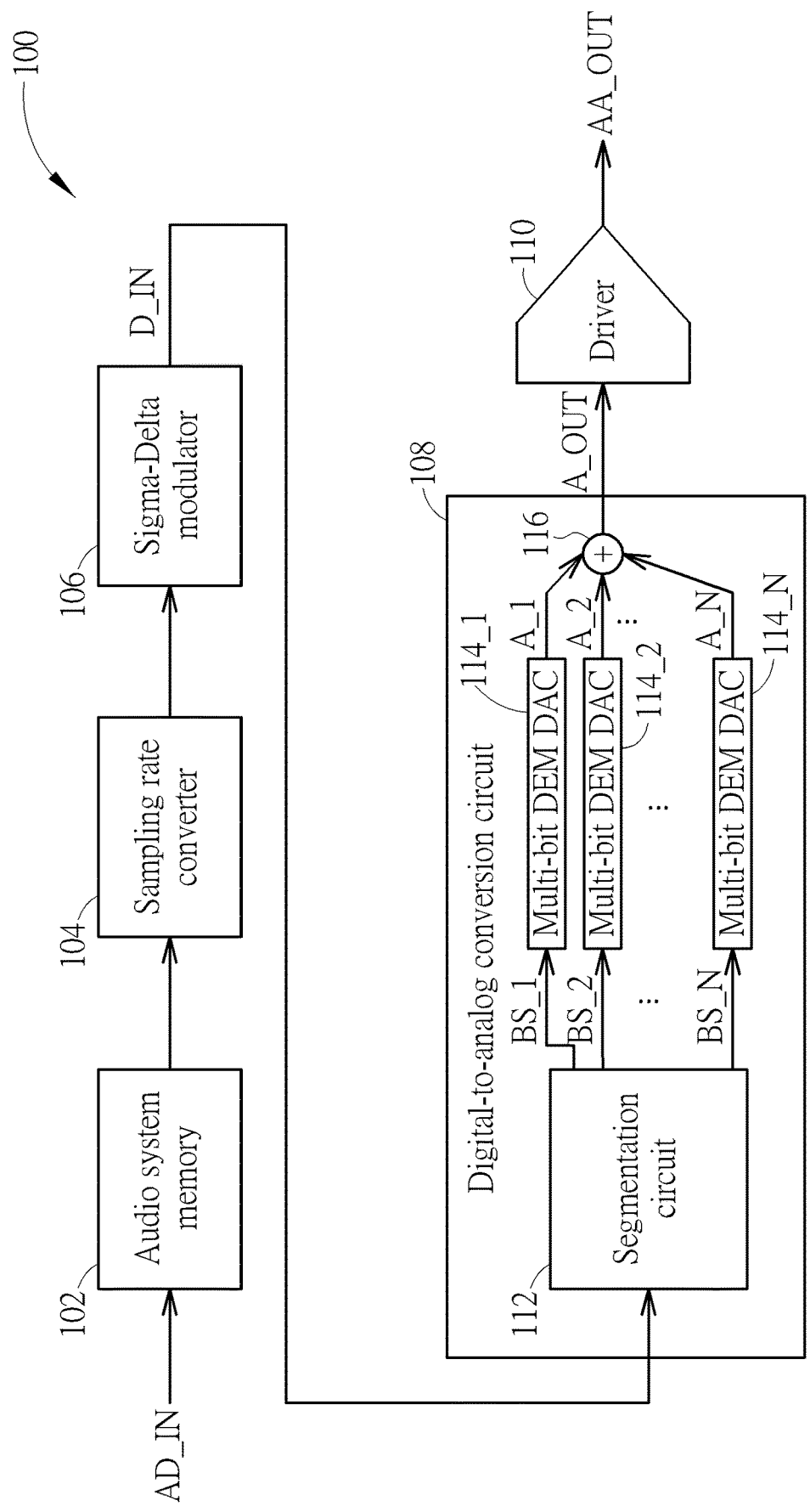
FIG. 1 is a block diagram illustrating an audio down-link system according to an embodiment of the present invention.

FIG. 1 is a block diagram illustrating an audio down-link system according to an embodiment of the present invention. The audio down-link system 100 includes an audio system memory 102, a sampling rate converter 104, a sigma-delta modulator 106, a digital-to-analog conversion circuit 108, and a driver 110. The audio system memory 102 is used to buffer an audio digital input AD_IN (e.g., a digital input consisting of audio samples, each being a binary code having multiple bits) generated from a preceding digital circuit (not shown). The sampling rate converter 104 acts as an interpolator. For example, the sampling rate converter 104 receives the audio digital input AD_IN at a first sampling clock rate, and performs an interpolation upon audio samples of the audio digital input AD_IN to generate an audio digital input with a second sampling clock rate that is higher than the first sampling clock rate. An audio digital input with a higher sampling clock rate is processed by the sigma-delta modulator 106. The sigma-delta modulator 106 shapes the quantization noise, thereby generating a noise shaped signal as a digital input D_IN for the following processing circuit (e.g., digital-to-analog conversion circuit 108). The digital-to-analog conversion circuit 108 converts the digital input D_IN into an analog output A_OUT. The driver 110 may include an analog filter and a driving circuit, where the analog filter is used to remove high-frequency noises from the analog output A_OUT, and the driving circuit is used to generate an audio analog output AA_OUT to an audio playback device according to an output of the analog filter.

In this embodiment, the digital-to-analog conversion circuit 108 employs the proposed high linearity DAC architecture, and includes a plurality of circuit blocks for achieving the intended digital-to-analog conversion function. As shown in FIG. 1, the digital-to-analog conversion circuit 108 includes a segmentation circuit 112, a plurality of multi-bit dynamic element matching digital-to-analog converters (DEM DACs) 114_1-114_N, and a combination circuit 116, where N is a positive integer larger than one. The segmentation circuit 112 is arranged to apply segmentation to the digital input D_IN (e.g., one audio sample that is an M-bit binary code, where M is a positive integer larger than one) to generate a plurality of code segments BS_1-BS_N. The multi-bit DEM DACs 114_1-114_N are arranged to convert the code segments BS_1-BS_N into a plurality of DAC outputs A_1-A_N, respectively. The combination circuit 116 is arranged to combine the DAC outputs A_1-A_N to generate the analog output A_OUT.

It should be noted that the multi-bit DEM DACs 114_1-114_N may be configured to have different weights relative to each other, depending upon the actual segmentation design employed by the segmentation circuit 112.

In accordance with the proposed high linearity DAC architecture, not all of the multi-bit DEM DACs 114_1-114_N employ the same DEM technique. Specifically, the multi-bit DEM DACs 114_1-114_N include at least a first multi-bit DEM DAC transmitting the most significant bits (MSB) and a second multi-bit DEM DAC transmitting the least significant bits (LSB), and the first multi-bit DEM DAC and the second multi-bit DEM DAC employ different DEM techniques. For example, the first multi-bit DEM DAC employs a first DEM technique that uses a rotated pulse width modulation (PWM) algorithm, and the second multi-bit DEM DAC employs a second DEM technique with complexity lower than that of the first DEM technique, such as a data weighted averaging (DWA) algorithm or a scrambling algorithm.

Figure 2:
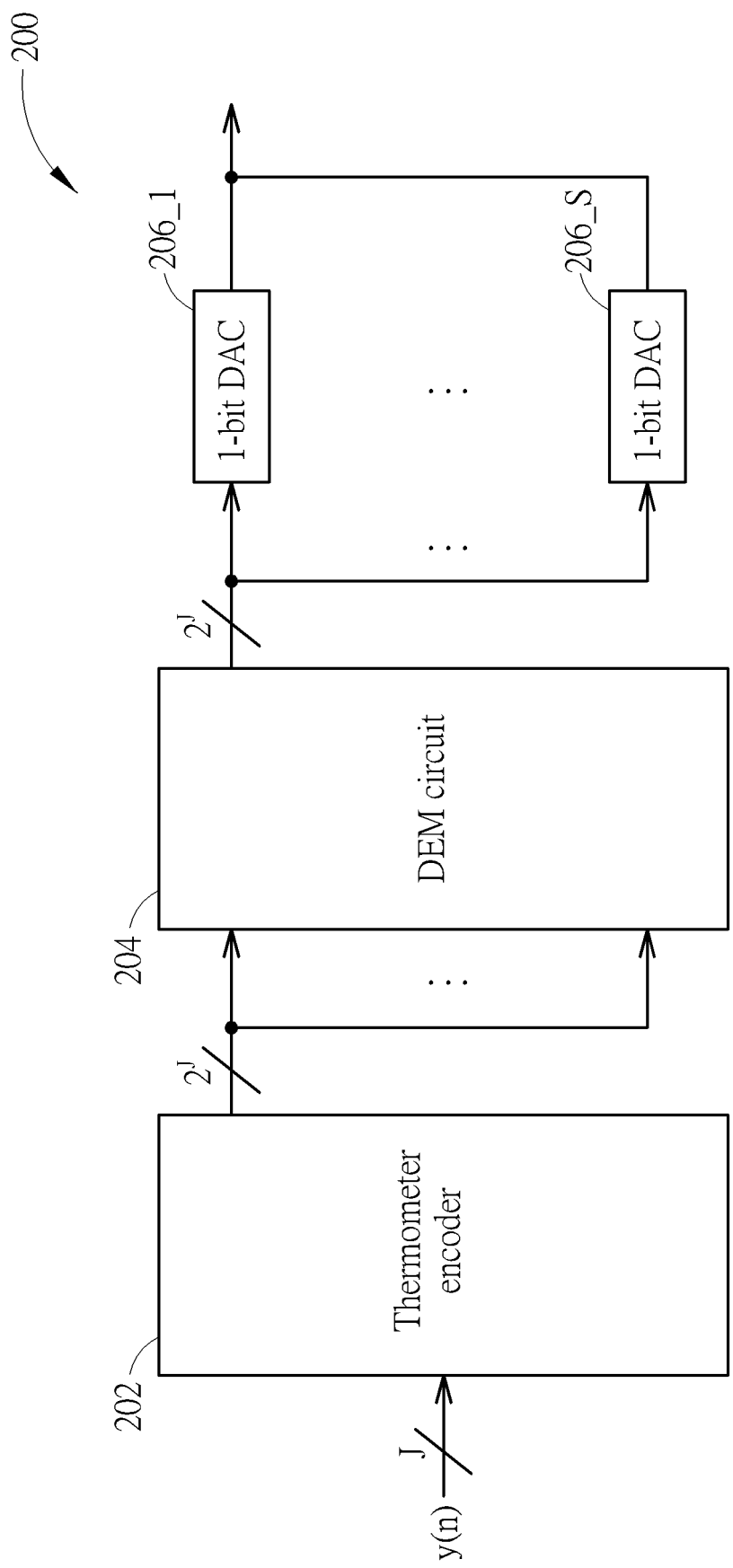
FIG. 2 is a diagram illustrating a multi-bit DEM DAC using a DWA technique according to an embodiment of the present invention.

FIG. 2 is a diagram illustrating a multi-bit DEM DAC using a DWA technique according to an embodiment of the present invention. For example, one of the multi-bit DEM DACs 114_1-114_N shown in FIG. 1 may be implemented using the multi-bit DEM DAC 200 shown in FIG. 2. The multi-bit DEM DAC 200 includes a plurality of circuits, such as a thermometer encoder 202, a DEM circuit 204, and a plurality of 1-bit DACs 206_1-206_M. For example, each of the 1-bit DACs 206_1-206_S may act as one DAC cell that is selectively switched on according to its input bit value. Supposing that an input code y(n) has J bits, the number of DAC cells is equal to $2^J$ (i.e., $S=2^J$), where J is a positive integer larger than one.

The thermometer encoder 202 is used to perform a binary-to-thermometer conversion. Hence, the input code y(n) is thermometer coded by the thermometer encoder 202, and $2^J$ bits generated from the thermometer encoder 202 are realigned by the DEM circuit 204 before entering the 1-bit DACs 206_1-206_S. In this embodiment, the DEM circuit 204 is used to perform realigning upon bits of a thermometer code generated from the thermometer encoder 202 according to a DWA algorithm.

Figure 3:
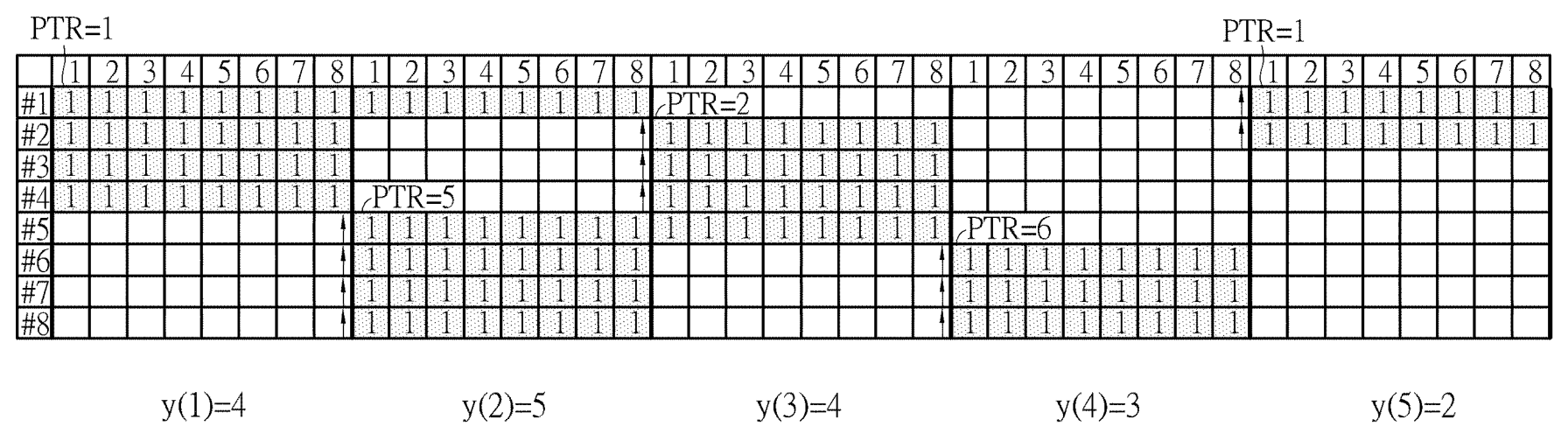

FIG. 3 is a diagram illustrating a DWA operation performed at the DEM circuit 204 shown in FIG. 2. Supposing that the input code y(n) has 3 bits (J=3), the multi-bit DEM DAC 200 has eight 1-bit DACs 206_1-206_S ($S=2^3$) that are indexed by #1, #2, . . . , #8, respectively. As shown in FIG. 3, consecutive code values {4, 5, 4, 3, 2} represented by the input codes y(n) are successively fed into the multi-bit DEM DAC 200, where n={1, 2, 3, 4, 5}. When the code value {4} represented by the input code y(1) is received by the multi-bit DEM DAC 200, a thermometer code generated from the thermometer encoder 202 includes four 1's and four 0's. A start pointer PTR records a starting DAC index value for each DWA cycle. The start pointer PTR is initially set by 1 (i.e., PTR=1). Hence, four 1's are fed into 1-bit DACs indexed by #1, #2, #3, and #4. When the code value {5} represented by the input code y(2) is received by the multi-bit DEM DAC 200, a thermometer code generated from the thermometer encoder 202 includes five 1's and three 0's. The start pointer PTR is updated to 5 (i.e., PTR=5) by the DWA algorithm. Hence, five 1's are fed into 1-bit DACs indexed by #5, #6, #7, #8, and #1. When the code value {4} represented by the input code y(3) is received by the multi-bit DEM DAC 200, a thermometer code generated from the thermometer encoder 202 includes four 1's and four 0's. The start pointer PTR is updated to 2 (i.e., PTR=2) by the DWA algorithm. Hence, four 1's are fed into 1-bit DACs indexed by #2, #3, #4, and #5. When the code value {3} represented by the input code y(4) is received by the multi-bit DEM DAC 200, a thermometer code generated from the thermometer encoder 202 includes three 1's and five 0's. The start pointer PTR is updated to 6 (i.e., PTR=6) by the DWA algorithm. Hence, three 1's are fed into 1-bit DACs indexed by #6, #7, and #8. When the code value {2} represented by the input code y(5) is received by the multi-bit DEM DAC 200, a thermometer code generated from the thermometer encoder 202 includes two 1's and six 0's. The start pointer PTR is updated to 1 (i.e., PTR=1) by the DWA algorithm. Hence, two 1's are fed into 1-bit DACs indexed by #1 and #2.

The DWA algorithm is capable of shaping the static element mismatch by a first-order transfer function $(1-Z^{-1})$. The practical 1-bit DACs, however, do not transit instantaneously between their two levels, thus introducing transient errors at rising edges and falling edges. Such rising and falling transient errors are said to contain ISI. For clarity and simplicity, the following considers the rising transient errors only. As shown in FIG. 3, the occurrence of one rising transient error is indicated by an upward arrow symbol. Taking rising transient errors for example, the number of transitions from 0 to 1 depends on the input code y(n). Hence, signal-dependent ISI errors are introduced by the DWA algorithm.

Figure 4:
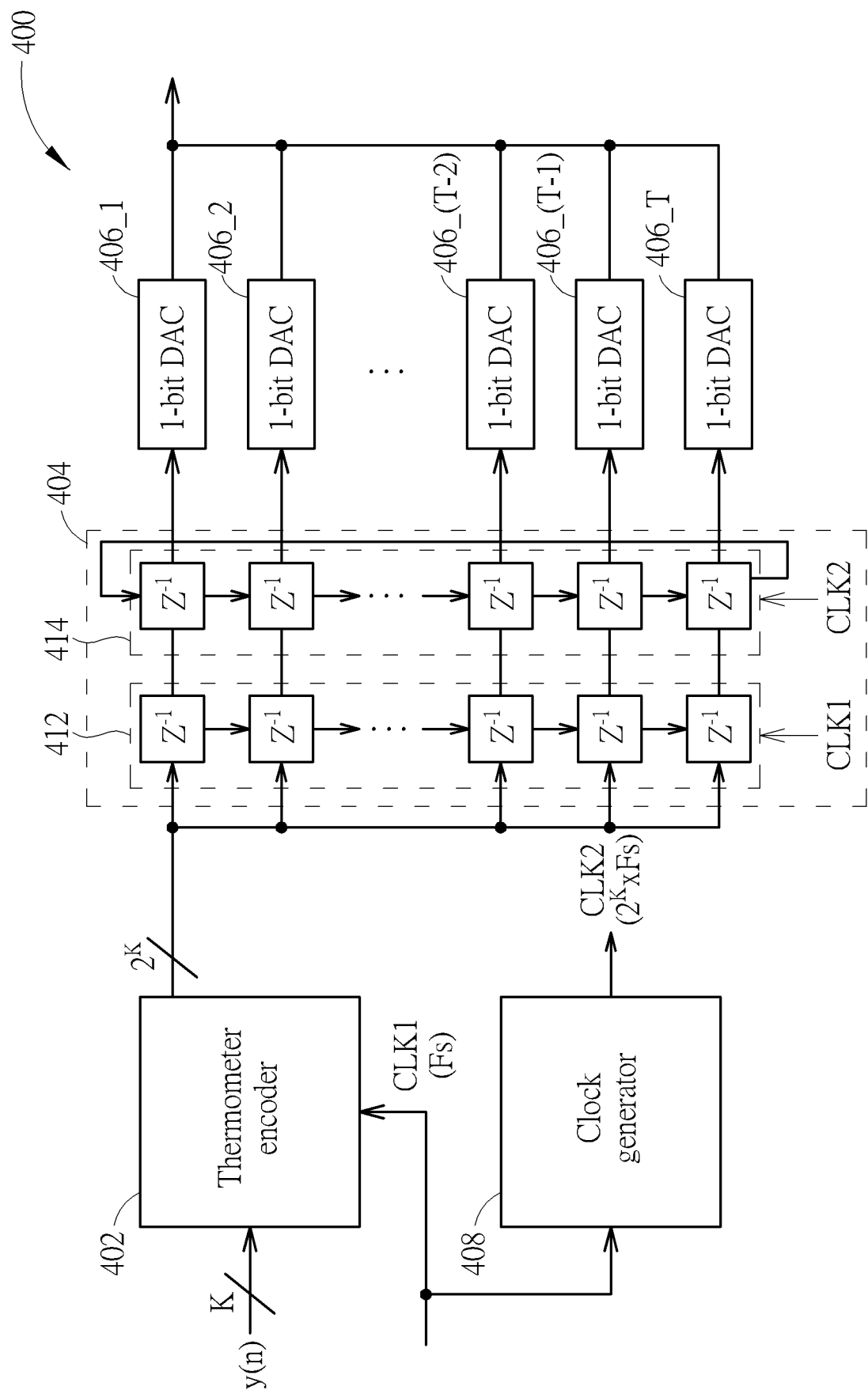
FIG. 4 is a diagram illustrating a multi-bit DEM DAC using a rotated PWM technique according to an embodiment of the present invention.

FIG. 4 is a diagram illustrating a multi-bit DEM DAC using a rotated PWM technique according to an embodiment of the present invention. For example, one of the multi-bit DEM DACs 114_1-114_N shown in FIG. 1 may be implemented using the multi-bit DEM DAC 400 shown in FIG. 4. The multi-bit DEM DAC 400 includes a plurality of circuits, such as a thermometer encoder 402, a PWM code rotator 404, a plurality of 1-bit DACs 406_1-406_T, and a clock generator 408. For example, each of the 1-bit DACs 406_1-406_T may act as one DAC cell that is selectively switched on according to its input bit value. Supposing that an input code y(n) has K bits, the number of DAC cells is equal to $2^K$ (i.e., $T=2^K$), where K is a positive integer larger than one.

The thermometer encoder 402 is used to perform a binary-to-thermometer conversion. Hence, the input code y(n) is thermometer coded by the thermometer encoder 402, and $2^K$ bits generated from the thermometer encoder 402 are realigned by the PWM code rotator 404 before entering the 1-bit DACs 406_1-406_T. The PWM code rotator 404 performs realigning upon bits of a thermometer code generated from the thermometer encoder 402 according to a rotated PWM algorithm.

The PWM code rotator 404 includes a sample-and-hold circuit 412 and a shift register 414, each having a plurality of storage elements (denoted by "$Z^{-1}$"). The sample-and-hold circuit 412 is used to store a $2^K$-bit thermometer code of a current input code (which is a K-bit binary code) within one sampling period defined by a sampling clock CLK1 that operates at a sampling clock rate Fs. By way of example, but not limitation, the segmentation circuit 112 also operates according to the sampling clock CLK1. Then, the shift register 414 rotates $2^K$ bits of the thermometer code of the current input code according to a sampling clock CLK2 that operates at a sampling clock rate $2^K*Fs$.

The clock generator 408 may be a phase-locked loop (PLL) or a delay-locked loop (DLL), and is used to generate the sampling clock CLK2 with the higher sampling clock rate $2^K*Fs$ according to the sampling clock CLK1 with the lower sampling clock rate Fs. The sampling clock CLK1 is used by the thermometer encoder 402 to output thermometer codes at the sampling clock rate Fs, and is also used by the sample-and-hold circuit 412 to pre-load a $2^K$-bit thermometer code of a next input code (which is a K-bit binary code) within the same sampling period during which the $2^K$-bit thermometer code of the current input code are processed by the rotated PWM algorithm.

Figure 5:
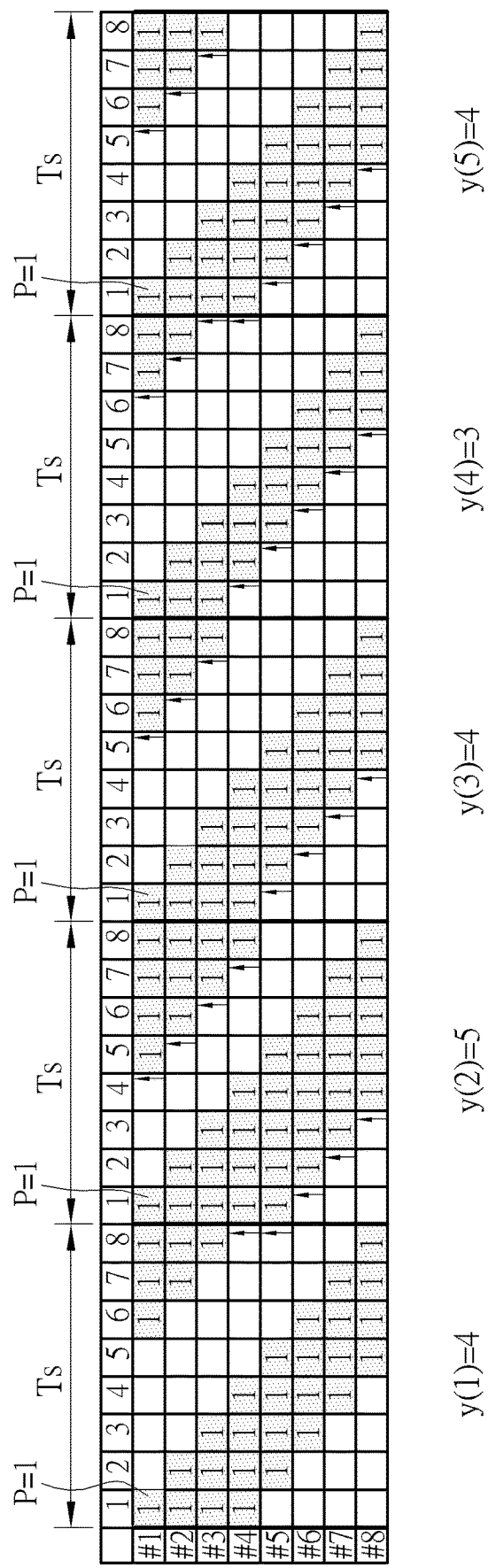
FIG. 5 is a diagram illustrating a rotated PWM operation performed at a PWM code rotator shown in FIG. 4.

FIG. 5 is a diagram illustrating a rotated PWM operation performed at the PWM code rotator 404 shown in FIG. 4. Supposing that the input code y(n) has 3 bits (K=3), the multi-bit DEM DAC 400 has eight 1-bit DACs 406_1-406_T ($T=2^3$) that are indexed by #1, #2, . . . , #8, respectively. As shown in FIG. 5, consecutive code values {4, 5, 4, 3, 4} represented by the input codes y(n) are successively fed into the multi-bit DEM DAC 400, where n={1, 2, 3, 4, 5}. In addition, there are $2^K$ phases (denoted by "1", "2", "3", "4", "5", "6", "7", and "8") in each sampling period Ts, where K=3 and $$Ts = \frac{1}{Fs}.$$

When the code value {4} represented by the input code y(1)/y(3)/y(5) is received by the multi-bit DEM DAC 400, a thermometer code generated from the thermometer encoder 402 includes four 1's and four 0's. A start pointer P records a starting DAC index value for each rotated PWM cycle. The start pointer P is initially set by 1 (i.e., P=1). Hence, four 1's are fed into 1-bit DACs indexed by #1, #2, #3, and #4 at phase 1, four 1's are rotated/shifted and then fed into 1-bit DACs indexed by #2, #3, #4, and #5 at phase 2, four 1's are rotated/shifted and then fed into 1-bit DACs indexed by #3, #4, #5, and #6 at phase 3, four 1's are rotated/shifted and then fed into 1-bit DACs indexed by #4, #5, #6, and #7 at phase 4, four 1's are rotated/shifted and then fed into 1-bit DACs indexed by #5, #6, #7, and #8 at phase 5, four 1's are rotated/shifted and then fed into 1-bit DACs indexed by #6, #7, #8, and #1 at phase 6, four 1's are rotated/shifted and then fed into 1-bit DACs indexed by #7, #8, #1, and #2 at phase 7, and four 1's are rotated/shifted and then fed into 1-bit DACs indexed by #8, #1, #2, and #3 at phase 8.

When the code value {5} represented by the input code y(2) is received by the multi-bit DEM DAC 400, a thermometer code generated from the thermometer encoder 402 includes five 1's and three 0's. The start pointer P is a fixed DAC index value (i.e., P=1). Hence, five 1's are fed into 1-bit DACs indexed by #1, #2, #3, #4, and #5 at phase 1, five 1's are rotated/shifted and then fed into 1-bit DACs indexed by #2, #3, #4, #5, and #6 at phase 2, five 1's are rotated/shifted and then fed into 1-bit DACs indexed by #3, #4, #5, #6, and #7 at phase 3, five 1's are rotated/shifted and then fed into 1-bit DACs indexed by #4, #5, #6, #7, and #8 at phase 4, five 1's are rotated/shifted and then fed into 1-bit DACs indexed by #5, #6, #7, #8, and #1 at phase 5, five 1's are rotated/shifted and then fed into 1-bit DACs indexed by #6, #7, #8, #1, and #2 at phase 6, five 1's are rotated/shifted and then fed into 1-bit DACs indexed by #7, #8, #1, #2, and #3 at phase 7, and five 1's are rotated/shifted and then fed into 1-bit DACs indexed by #8, #1, #2, #3, and #4 at phase 8.

When the code value {3} represented by the input code y(4) is received by the multi-bit DEM DAC 400, a thermometer code generated from the thermometer encoder 402 includes three 1's and five 0's. The start pointer P is a fixed DAC index value (i.e., P=1). Hence, three 1's are fed into 1-bit DACs indexed by #1, #2, and #3 at phase 1, three 1's are rotated/shifted and then fed into 1-bit DACs indexed by #2, #3, and #4 at phase 2, three 1's are rotated/shifted and then fed into 1-bit DACs indexed by #3, #4, and #5 at phase 3, three 1's are rotated/shifted and then fed into 1-bit DACs indexed by #4, #5, and #6 at phase 4, three 1's are rotated/shifted and then fed into 1-bit DACs indexed by #5, #6, and #7 at phase 5, three 1's are rotated/shifted and then fed into 1-bit DACs indexed by #6, #7, and #8 at phase 6, three 1's are rotated/shifted and then fed into 1-bit DACs indexed by #7, #8, and #1 at phase 7, and three 1's are rotated/shifted and then fed into 1-bit DACs indexed by #8, #1, and #2 at phase 8.

Like the DWA algorithm, the rotated PWM algorithm is capable of shaping the static element mismatch. As mentioned above, the practical 1-bit DACs do not transit instantaneously between their two levels, thus introducing transient errors at rising edges and falling edges. Such rising and falling transient errors are said to contain ISI. In accordance with the rotated PWM technique, the 1-bit DACs are switched on in an ordered sequence and are switched off in an ordered sequence, regardless of code values represented by input codes. In other words, the number of transitions is not signal dependent. For clarity and simplicity, the following considers the rising transient errors only. As shown in FIG. 5, the occurrence of one rising transient error is indicated by an upward arrow symbol, and there are fixed transitions from 0 to 1. Compared to the DWA algorithm that causes signal-dependent ISI errors, the rotated PWM algorithm has constant ISI errors. However, a high sampling clock rate (e.g., $2^K * Fs$) is required by the rotated PWM algorithm.

Suppose that a digital output of the sigma-delta modulator 106 is a binary code with M bits, where M>J and M>K. Considering a case where the digital-to-analog conversion circuit 108 is implemented by a single multi-bit DEM DAC that only employs the DWA algorithm, the single multi-bit DEM DAC is capable of shaping the static element mismatch. However, the single multi-bit DEM DAC suffers from signal-dependent ISI errors. To address the signal-dependent ISI issue, the single multi-bit DEM DAC that only employs the DWA algorithm may be replaced by a single multi-bit DEM DAC that only employs the rotated PWM algorithm. Considering another case where the digital-to-analog conversion circuit 108 is implemented by a single multi-bit DEM DAC that only employs the rotated PWM algorithm, the single multi-bit DEM DAC is capable of shaping the static element mismatch, and is free from signal-dependent ISI errors. However, a higher sampling clock rate (e.g., $2^M * Fs$) is required, thus increasing hardware complexity and power consumption. To address this high sampling clock rate issue, the present invention proposes high linearity DAC architecture that employs segmentation (e.g., noise shaped segmentation) and different DEM techniques (e.g., DWA algorithm and rotated PWM algorithm).

Figure 6:
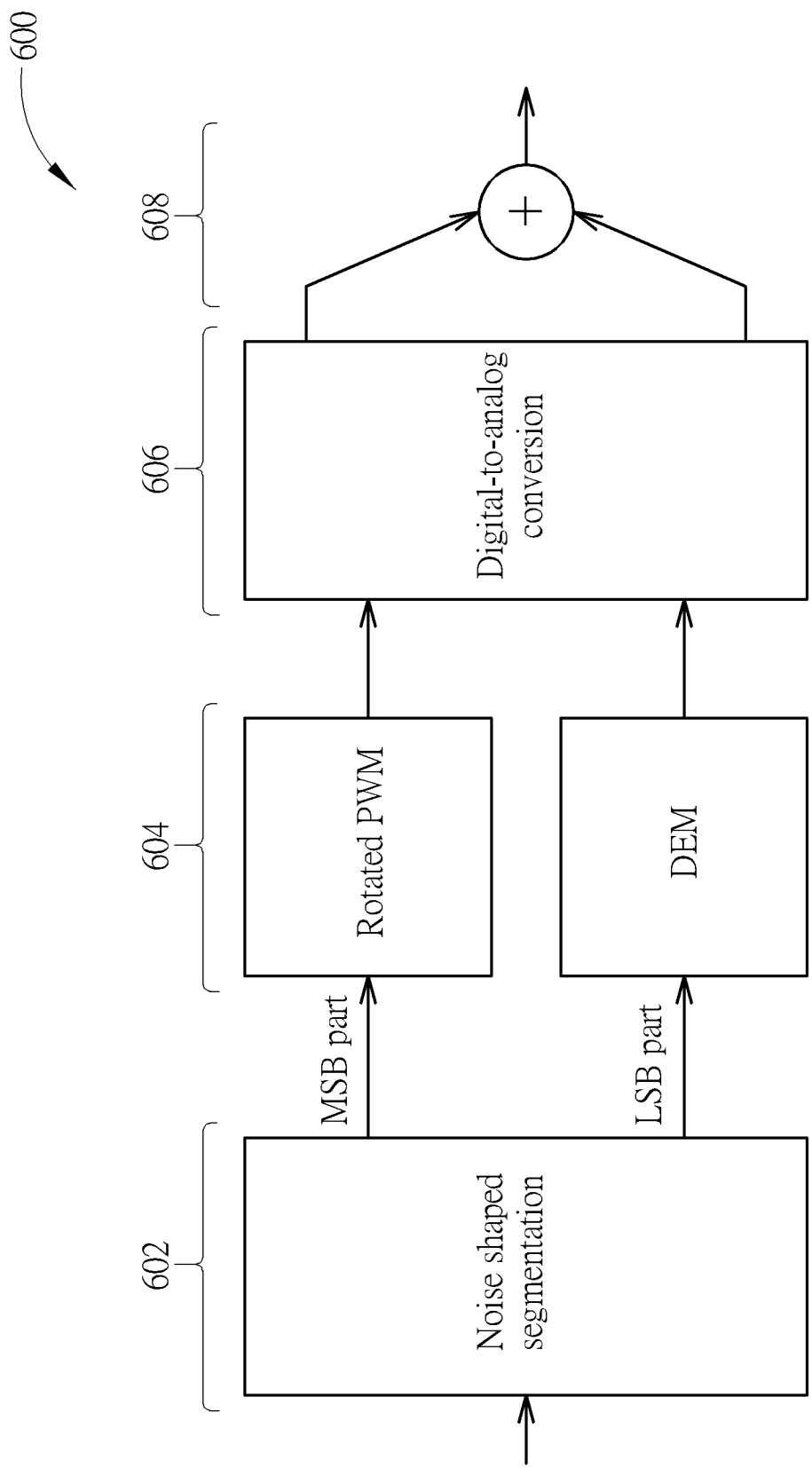
FIG. 6 is a diagram illustrating one high linearity DAC architecture according to an embodiment of the present invention.

FIG. 6 is a diagram illustrating one high linearity DAC architecture according to an embodiment of the present invention. The high linearity DAC architecture 600 includes a noise shaped segmentation stage 602, a DEM encoding stage 604, a digital-to-analog conversion stage 606, and a combination stage 608. In this example, the noise shaped segmentation stage 602 applies noise shaped segmentation to a digital input (which is a multi-bit binary code) to generate one multi-bit code segment containing a most significant bit (MSB) part of the digital input and another multi-bit code segment containing a least significant bit (LSB) part of the digital input. The DEM encoding stage 604 employs different DEM techniques, including the rotated PWM technique used to deal with the MSB part and a simple DEM technique (e.g., DWA technique) used to deal with the LSB part. It should be noted that binary-to-thermometer conversion may be involved in the DEM encoding stage 604, depending upon the actual design considerations.

A DAC output associated with the MSB part and a DAC output associated with the LSB part are generated from the digital-to-analog conversion stage 606 and then combined at the combination stage 608. It should be noted that different weights may be used by the digital-to-analog conversion stage 606 for generating the DAC output associated with the MSB part and the DAC output associated with the LSB part due to the fact that a weighted sum of the MSB part and the LSB part generated from the noise shaped segmentation stage 602 equals the original digital input received by the noise shaped segmentation stage 602.

Figure 7:
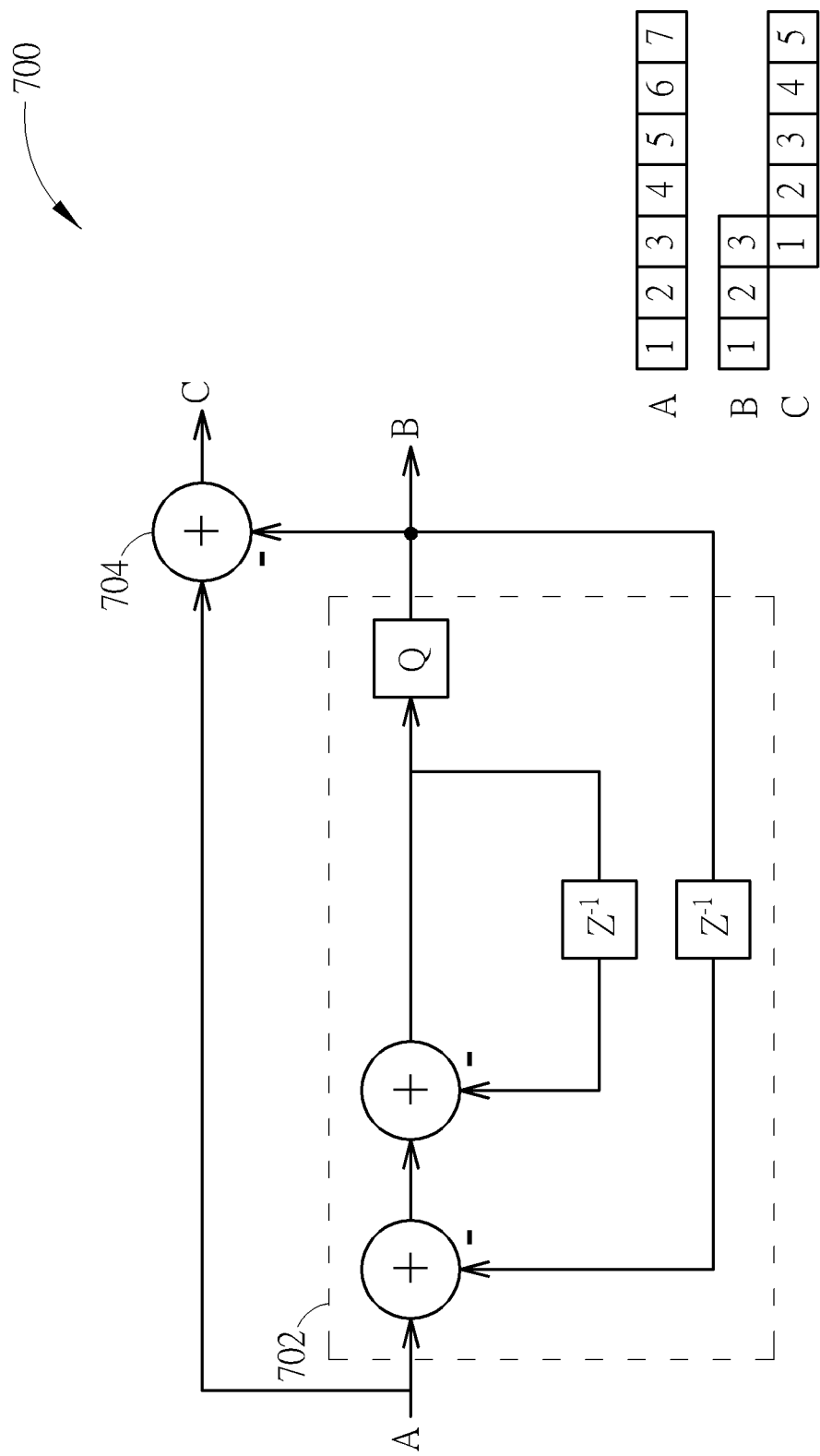
FIG. 7 is a diagram illustrating one noise shaped segmentation circuit according to an embodiment of the present invention.

FIG. 7 is a diagram illustrating one noise shaped segmentation circuit according to an embodiment of the present invention. For example, the noise shaped segmentation stage 602 may be implemented using the noise shaped segmentation circuit 700. The noise shaped segmentation circuit 700 includes a digital modulator 702 that reduces a bit length of a digital input A (e.g., a 7-bit binary code) to generate a code segment B (e.g., a 3-bit binary code) that is associated with an MSB part of the digital input A. The noise shaped segmentation circuit 700 further includes an adder 704 that subtracts the code segment B from the original digital input A (with most significant bits aligned) to produce a code segment C (e.g., a 5-bit binary code) that is associated with an LSB part of the digital input A. Since the code segment C is the difference between the input and output of a noise shaper, it represents only the shaped quantization noise of the digital modulator 702 and does not contain any signal component. The signal component is represented in the code segment B only. In this example, different weights (e.g., $2^{(7-3)}:1$) may be used by the digital-to-analog conversion stage 606 for generating the DAC output associated with the MSB part (e.g., 3-bit binary code) and the DAC output associated with the LSB part (e.g., 5-bit binary code) due to the fact that a weighted sum of the MSB part and the LSB part (e.g., 16*B+C) equals the original digital input A (e.g., 7-bit binary code).

Considering a case where the digital-to-analog conversion circuit 108 is built on the basis of the high linearity DAC architecture 600 that uses the noise shaped segmentation circuit 700, the value of N is equal to 2. That is, two code segments BS_1 and BS_N (N=2) are derived from the digital input D_IN. For example, the segmentation circuit 112 is a noise shaped segmentation circuit that generates the code segment BS_1 containing an LSB part of the digital input D_IN and the code segment BS_N (N=2) containing an MSB part of the digital input D_IN. In addition, the multi-bit DEM DAC 114_N (N=2) is implemented by a multi-bit DEM DAC that employs a rotated PWM technique (e.g., multi-bit DEM DAC 400 shown in FIG. 4), and the multi-bit DEM DAC 114_1 employs a DEM technique with complexity lower than that of the rotated PWM technique. For example, the multi-bit DEM DAC 114_1 may be implemented by a multi-bit DEM DAC that employs the DWA technique (e.g., multi-bit DEM DAC 200 shown in FIG. 2). In this example, the code segment BS_1 is applied to the multi-bit DEM DAC 114_1 with weight 1× (e.g., current-steering DAC with 1× Iout), and the code segment BS_N (N=2) is applied to the multi-bit DEM DAC 114_N (N=2) with weight 16× (e.g., current-steering DAC with 16× Iout). Since the code segment BS_N (N=2) is a 3-bit binary code having a bit length shorter than that of the 7-bit digital input D_IN, the sampling clock rate needed by the PWM code rotator (particularly, shift register) in the multi-bit DEM DAC 114_N (N=2) is $2^3$*Fs that is much slower than $2^7$*Fs.

With regard to the high linearity DAC architecture 600 shown in FIG. 6, the noise shaped segment stage 602 outputs one MSB part as an input of the rotated PWM algorithm and one LSB part as an input of a simple DEM algorithm (e.g., DWA algorithm). However, this is for illustrative purposes only, and is not meant to be a limitation of the present invention. To further reduce the number of 1-bit DACs needed by the digital-to-analog conversion stage 606, the noise shaped segment stage 602 may be modified to output one MSB part and more than one LSB part.

Figure 8:
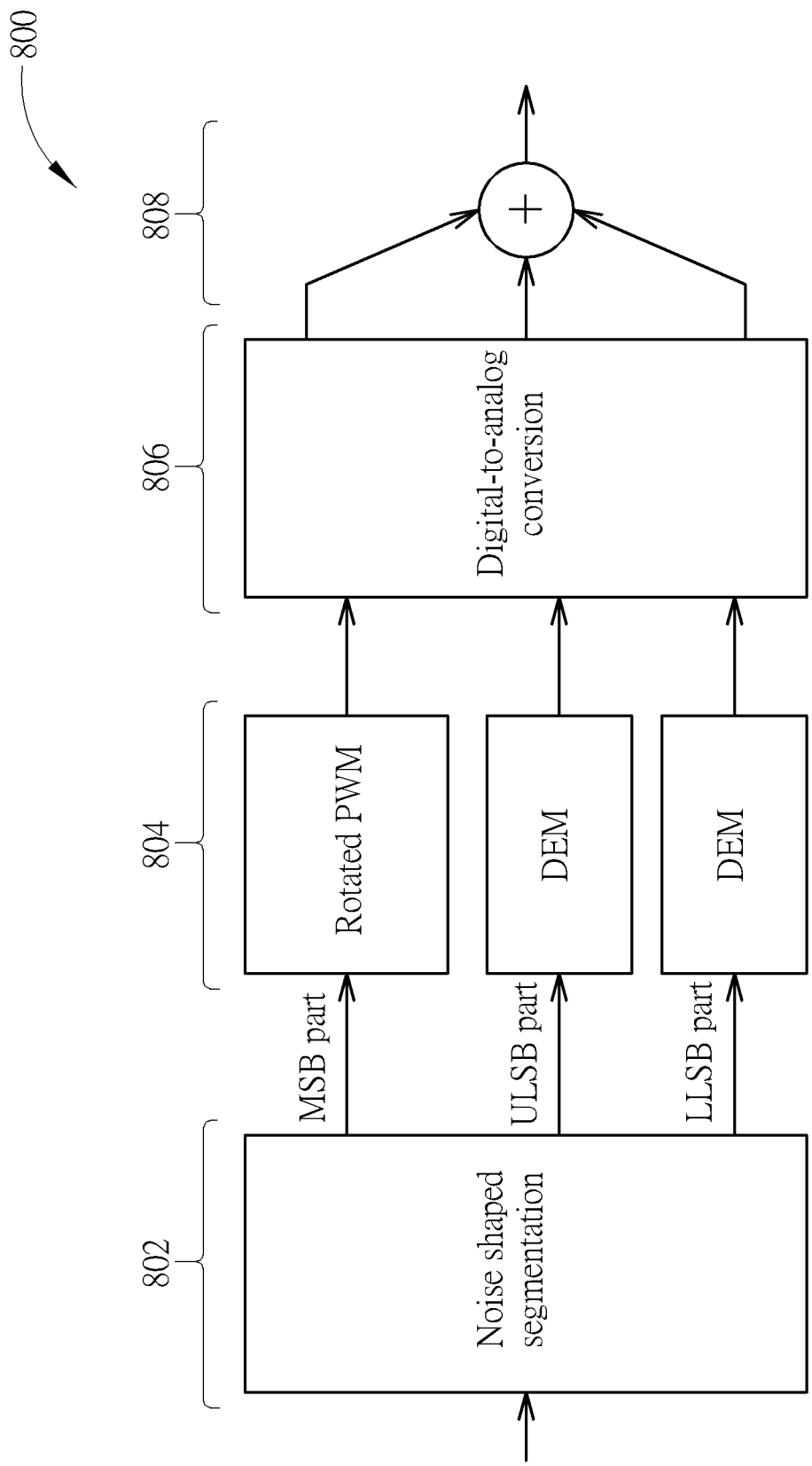
FIG. 8 is a diagram illustrating another high linearity DAC architecture according to an embodiment of the present invention.

FIG. 8 is a diagram illustrating another high linearity DAC architecture according to an embodiment of the present invention. The high linearity DAC architecture 800 includes a noise shaped segmentation stage 802, a DEM encoding stage 804, a digital-to-analog conversion stage 806, and a combination stage 808. In this example, the noise shaped segmentation stage 802 applies noise shaped segmentation to a digital input (which is a multi-bit binary code) to generate a multi-bit code segment containing an MSB part of the digital input, a multi-bit code segment containing an upper least significant bit (ULSB) part of the digital input, and a multi-bit code segment containing a lower least significant bit (LLSB) part of the digital input. The DEM encoding stage 804 employs different DEM techniques, including the rotated PWM technique used to deal with the MSB part and a simple DEM technique (e.g., DWA technique) used to deal with each of the ULSB part and LLSB part. It should be noted that binary-to-thermometer conversion may be involved in the DEM encoding stage 804, depending upon the actual design considerations.

A DAC output associated with the MSB part, a DAC output associated with the ULSB part and a DAC output associated with the LLSB part are generated from the digital-to-analog conversion stage 806 and then combined at the combination stage 808. It should be noted that different weights may be used by the digital-to-analog conversion stage 806 for generating the DAC output associated with the MSB part, the DAC output associated with the ULSB part and the DAC output associated with the LLSB part due to the fact that a weighted sum of the MSB part, the ULSB part and the LLSB part generated from the noise shaped segmentation stage 802 equals the original digital input received by the noise shaped segmentation stage 802.

Figure 9:
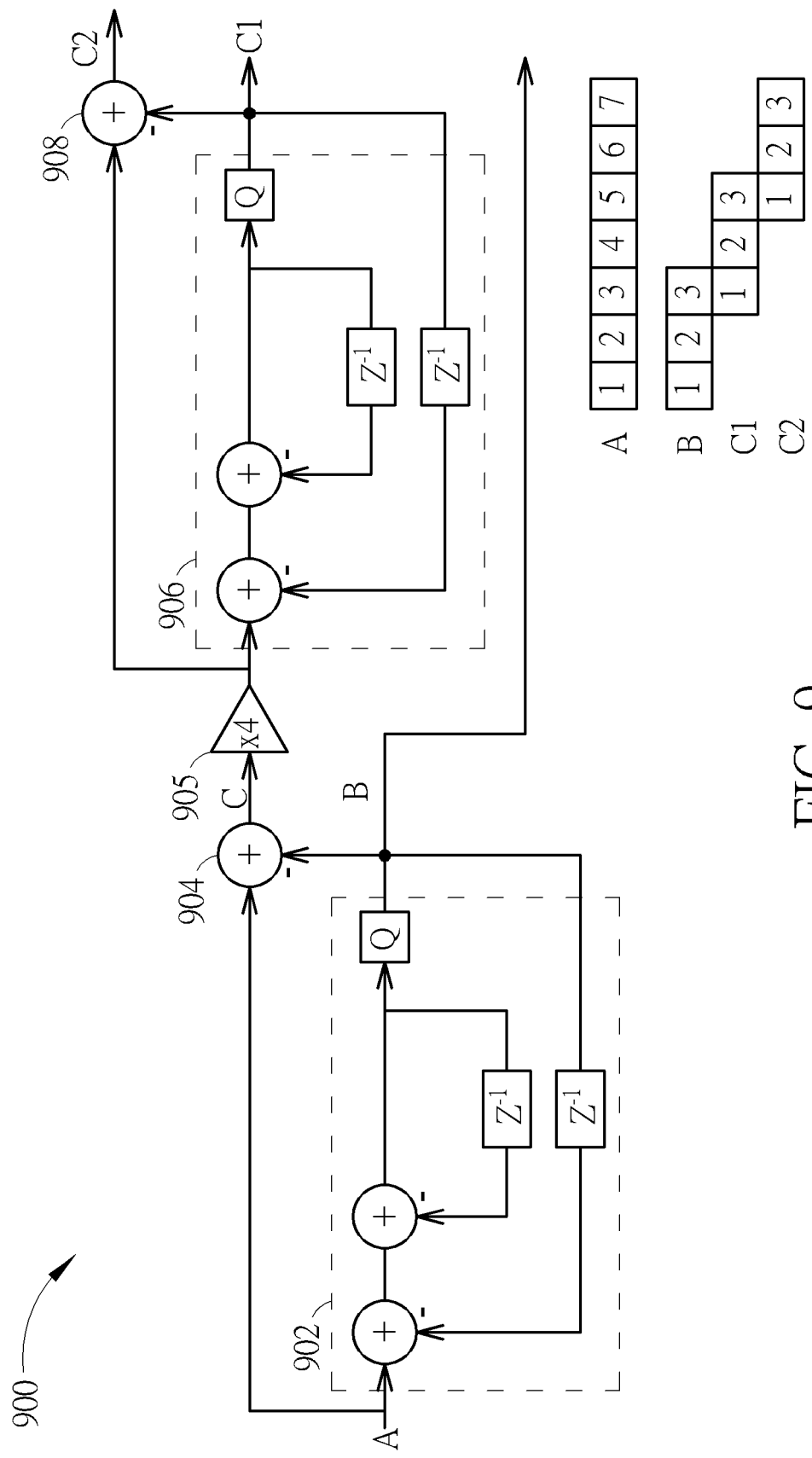
FIG. 9 is a diagram illustrating another noise shaped segmentation circuit according to an embodiment of the present invention.

FIG. 9 is a diagram illustrating another noise shaped segmentation circuit according to an embodiment of the present invention. For example, the noise shaped segmentation stage 802 may be implemented using the noise shaped segmentation circuit 900. The noise shaped segmentation circuit 900 includes a digital modulator 902 that reduces a bit length of a digital input A (e.g., a 7-bit binary code) to generate a code segment B (e.g., a 3-bit binary code) that is associated with an MSB part of the digital input A. The noise shaped segmentation circuit 900 further includes an adder 904 that subtracts the code segment B from the original digital input A (with most significant bits aligned) to produce a code segment C (e.g., a 5-bit binary code) that is associated with an LSB part of the digital input A. The code segment C is processed by a digital modulator 906 after passing through a multiplier 905. The digital modulator 906 reduces a bit length of an output of the multiplier 905 to generate a code segment C1 (e.g., a 3-bit binary code) that is associated with a ULSB part of the digital input A. The noise shaped segmentation circuit 900 further includes an adder 908 that subtracts the code segment C1 from the output of the multiplier 905 (with most significant bits aligned) to produce a code segment C2 (e.g., a 3-bit binary code) that is associated with an LLSB part of the digital input A.

Since the code segment C is the difference between the input and output of a noise shaper, it represents only the shaped quantization noise of the digital modulator 902 and does not contain any signal component. The signal component is represented in the code segment B only. Similarly, since the code segments C1 and C2 are derived from the code segment C, none of the code segments C1 and C2 contains the signal component. In this example, different weights (e.g., $2^4:2^2:1$) may be used by the digital-to-analog conversion stage 806 for generating the DAC output associated with the MSB part (e.g., 3-bit binary code), the DAC output associated with the ULSB part (e.g., 3-bit binary code) and the DAC output associated with the LLSB part (e.g., 3-bit binary code) due to the fact that a weighted sum of the MSB part, the ULSB part and the LLSB part (e.g., 16*B+4*C1+C2) equals the original digital input A (e.g., 7-bit binary code).

Considering a case where the digital-to-analog conversion circuit 108 is built on the basis of the high linearity DAC architecture 800 that uses the noise shaped segmentation circuit 900, the value of N is equal to 3. That is, three code segments BS_1, BS_2, and BS_N (N=3) are derived from the digital input D_IN. For example, the segmentation circuit 112 is a noise shaped segmentation circuit that generates the code segment BS_1 containing an LLSB part of the digital input D_IN, the code segment BS_2 containing a ULSB part of the digital input D_IN, and the code segment BS_N (N=3) containing an MSB part of the digital input D_IN. The multi-bit DEM DAC 114_N (N=3) is implemented by a multi-bit DEM DAC that employs a rotated PWM technique (e.g., multi-bit DEM DAC 400 shown in FIG. 4). Each of the multi-bit DEM DACs 114_1 and 114_2 employs a DEM technique with complexity lower than that of the rotated PWM technique. For example, each of the multi-bit DEM DACs 114_1 and 114_2 may be implemented by a multi-bit DEM DAC that employs the DWA technique (e.g., multi-bit DEM DAC 200 shown in FIG. 2). In this example, the code segment BS_1 (LLSB part) is applied to the multi-bit DEM DAC 114_1 with weight 1× (e.g., current-steering DAC with 1× Iout), the code segment BS_2 (ULSB part) is applied to the multi-bit DEM DAC 114_2 with weight 4× (e.g., current-steering DAC with 4× Iout), and the code segment BS_N (MSB part) is applied to the multi-bit DEM DAC 114_N (N=3) with weight 16× (e.g., current-steering DAC with 16× Iout). Since the code segment BS_N (MSB part) is a 3-bit code having a bit length shorter than that of the 7-bit digital input D_IN, the sampling clock rate needed by the PWM code rotator (particularly, shift register) in the multi-bit DEM DAC 114_N (N=3) is $2^3$*Fs that is much slower than $2^7$*Fs.

As shown in FIG. 5, the start pointer is set by a fixed DAC index value (i.e., P=1) for the rotated PWM operation performed within each sampling period Ts. The constant ISI errors are introduced by the rotated PWM algorithm under a condition that the digital input has a slow signal change (e.g., code change=−1/0/+1). For example, a code change between code values represented by consecutive input codes y(1) and y(2) is +1, a code change between code values represented by consecutive input codes y(2) and y(3) is −1, a code change between code values represented by consecutive input codes y(3) and y(4) is −1, and a code change between code values represented by consecutive input codes y(4) and y(5) is +1. If the digital input has a fast signal change (e.g., code change≠−1/0/+1), non-constant ISI errors may be introduced by the rotated PWM algorithm with the start pointer set by a fixed DAC index value for each sampling period Ts.

Figure 10:
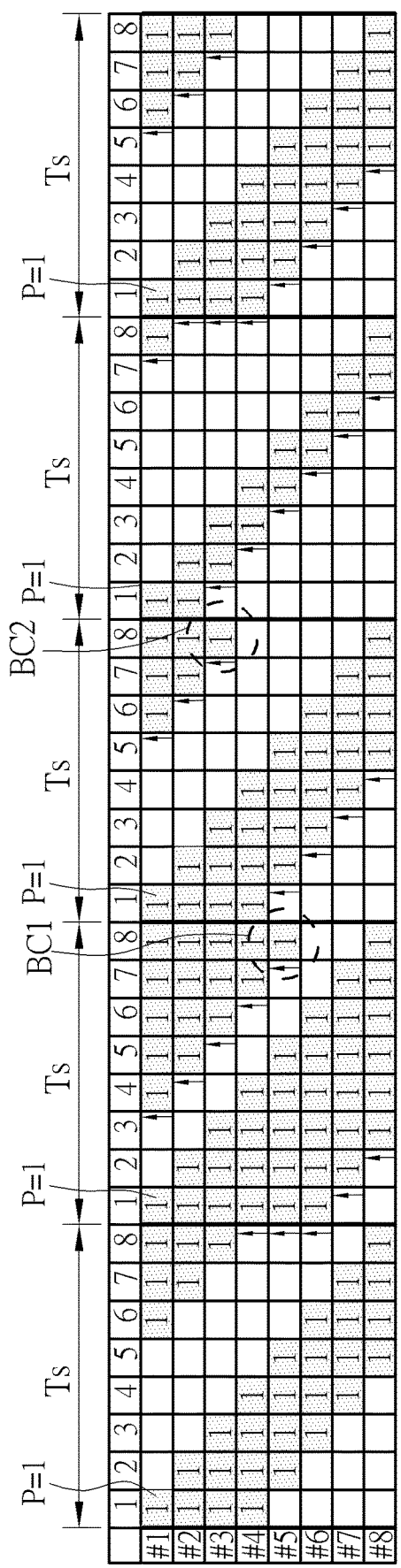
FIG. 10 is a diagram illustrating non-constant ISI errors resulting from applying a rotated PWM operation with a fixed start pointer to a digital input with a fast signal change.

FIG. 10 is a diagram illustrating non-constant ISI errors resulting from applying a rotated PWM operation with a fixed start pointer to a digital input with a fast signal change. In this example, a code change between code values represented by consecutive input codes y(1) and y(2) is +2, a code change between code values represented by consecutive input codes y(2) and y(3) is −2, a code change between code values represented by consecutive input codes y(3) and y(4) is −2, and a code change between code values represented by consecutive input codes y(4) and y(5) is +2. Supposing that the input code y(n) has 3 bits (K=3), the multi-bit DEM DAC 400 has eight 1-bit DACs 406_1-406_T (T=2³) that are indexed by #1, #2, . . . , #8, respectively.

When the code value {6} represented by the input code y(2) is received by the multi-bit DEM DAC 400, a thermometer code generated from the thermometer encoder 402 includes six 1's and two 0's. The start pointer P is set by a fixed DAC index value (i.e., P=1). At phase 8 within one sampling period Ts associated with the input code y(2), six 1's are fed into 1-bit DACs indexed by #8, #1, #2, #3, #4, and #5.

When the code value {4} represented by the input code y(3) is received by the multi-bit DEM DAC 400, a thermometer code generated from the thermometer encoder 402 includes four 1's and four 0's. The start pointer P is set by the fixed DAC index value (i.e., P=1). At phase 1 within one sampling period Ts associated with the input code y(3), four 1's are fed into 1-bit DACs indexed by #1, #2, #3, and #4. At phase 2 within one sampling period Ts associated with the input code y(3), four 1's are rotated/shifted and then fed into 1-bit DACs indexed by #2, #3, #4, and #5. As shown in FIG. 10, the 1-bit DAC indexed by #5 is switched on at phase 8 within one sampling period Ts associated with the input code y(2), switched off at phase 1 within one sampling period Ts associated with the input code y(3), and then switched on at phase 2 within one sampling period Ts associated with the input code y(3).

Furthermore, at phase 8 within one sampling period Ts associated with the input code y(3), four 1's are rotated/shifted and then fed into 1-bit DACs indexed by #8, #1, #2, and #3. When the code value {2} represented by the input code y(4) is received by the multi-bit DEM DAC 400, a thermometer code generated from the thermometer encoder 402 includes two 1's and six 0's. The start pointer P is set by the fixed DAC index value (i.e., P=1). At phase 1 within one sampling period Ts associated with the input code y(4), two 1's are fed into 1-bit DACs indexed by #1 and #2. At phase 2 within one sampling period Ts associated with the input code y(4), two 1's are rotated/shifted and then fed into 1-bit DACs indexed by #2 and #3. As shown in FIG. 10, the 1-bit DAC indexed by #3 is switched on at phase 8 within one sampling period Ts associated with the input code y(3), switched off at phase 1 within one sampling period Ts associated with the input code y(4), and then switched on at phase 2 within one sampling period Ts associated with the input code y(4).

As shown in FIG. 10, the occurrence of one rising transient error is indicated by an upward arrow symbol. Taking the rising transient errors for example, the number of (0→1) code transition at the 1-bit DAC indexed by #5 is increased. Specifically, a bubble code BC1 occurs at phase 8 within one sampling period Ts associated with the input code y(2), thus resulting in a non-constant ISI error. Similarly, taking the rising transient errors for example, the number of (0→1) code transition at the 1-bit DAC indexed by #3 is increased. Specifically, a bubble code BC2 occurs at phase 8 within one sampling period Ts associated with the input code y(4), thus resulting in a non-constant ISI error. Once the bubble codes are generated, they will diffuse into the following input codes.

To address this non-constant ISI error issue, the present invention further proposes a modified rotated PWM technique which employs an adaptively adjusted start pointer. For example, the PWM code rotator 404 included in the multi-bit DEM DAC 400 shown in FIG. 4 may be configured to employ the modified rotated PWM technique. In this way, the start pointer is not set by a fixed DAC index value for rotated PWM performed within each sampling period, thereby avoiding occurrence of non-constant ISI errors.

In one exemplary modified rotated PWM implementation, a setting of a start pointer for a code segment of a current digital input depends on a code difference between a code segment of a previous digital input and the code segment of the current digital input. In addition, a setting of a start pointer for a code segment of a next digital input depends on a code difference between the code segment of the next digital input and the code segment of the current digital input.

Figure 11:
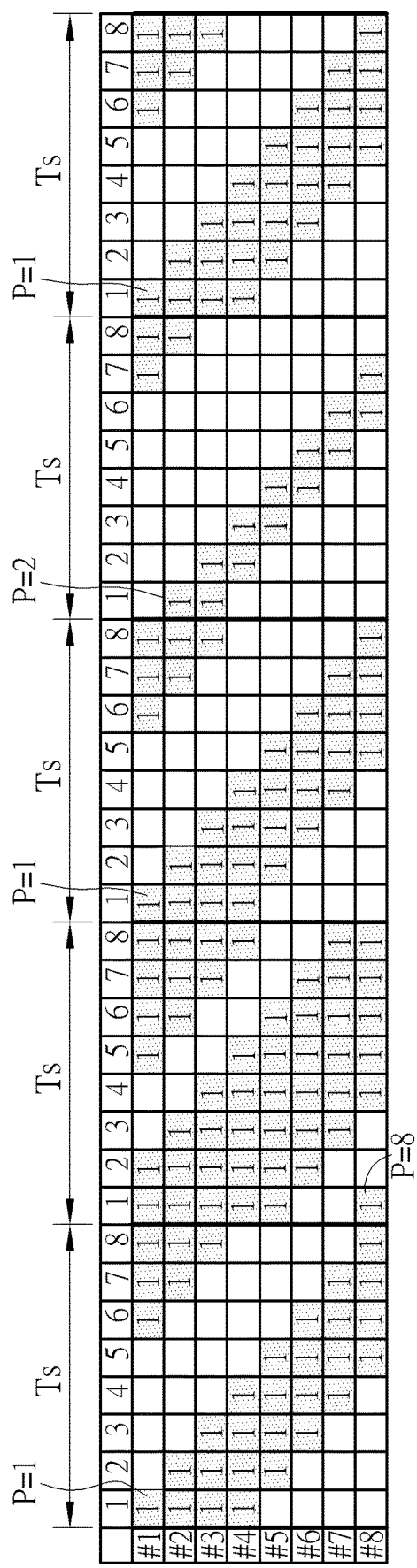
FIG. 11 is a diagram illustrating a first modified rotated PWM operation performed at the PWM code rotator shown in FIG. 4 according to an embodiment of the present invention.

FIG. 11 is a diagram illustrating a first modified rotated PWM operation performed at the PWM code rotator 404 shown in FIG. 4 according to an embodiment of the present invention. Supposing that the input code y(n) has 3 bits (K=3), the multi-bit DEM DAC 400 has eight 1-bit DACs 406_1-406_T (T=2³) that are indexed by #1, #2, . . . , #8, respectively. As shown in FIG. 11, consecutive code values {4, 6, 4, 3, 4} represented by the input codes y(n) are successively fed into the multi-bit DEM DAC 400, where n={1, 2, 3, 4, 5}. In addition, there are $2^K$ phases (denoted by "1", "2", "3", "4", "5", "6", "7", and "8") in each sampling period Ts, where K=3 and $$Ts = \frac{1}{Fs}.$$

When the code value {4} represented by the input code y(1) is received by the multi-bit DEM DAC 400, a thermometer code generated from the thermometer encoder 402 includes four 1's and four 0's. The start pointer P is initially set by 1 (i.e., P=1). When the code value {6} represented by the input code y(2) is received by the multi-bit DEM DAC 400, a thermometer code generated from the thermometer encoder 402 includes six 1's and two 0's. The start pointer P is changed from a previous DAC index value to a new DAC index value (i.e., P=8) according to a code difference Δy (Δy=y(2)−y(1)=6−2>+1). When the code value {4} represented by the input code y(3) is received by the multi-bit DEM DAC 400, a thermometer code generated from the thermometer encoder 402 includes four 1's and four 0's. The start pointer P is changed from a previous DAC index value to a new DAC index value (i.e., P=1) according to a code difference Δy (Δy=y(3)−y(2)=4−6<−1). When the code value {2} represented by the input code y(4) is received by the multi-bit DEM DAC 400, a thermometer code generated from the thermometer encoder 402 includes two 1's and six 0's. The start pointer P is changed from a previous DAC index value to a new DAC index value (i.e., P=2) according to a code difference Δy (Δy=y(4)−y(3)=2−4<−1). When the code value {4} represented by the input code y(5) is received by the multi-bit DEM DAC 400, a thermometer code generated from the thermometer encoder 402 includes four 1's and four 0's. The start pointer P is changed from a previous DAC index value to a new DAC index value (i.e., P=1) according to a code difference Δy (Δy=y(5)−y(4)=4−2>+1). Since there is no bubble code, the modified rotated PWM operation is free of non-constant ISI errors. Compared to the rotated PWM algorithm using a fixed start pointer, the modified rotated PWM algorithm has constant ISI errors under a condition that a fast change signal has a code change≠−1/0/+1.

In another exemplary modified rotated PWM implementation, a setting of a start pointer for a code segment of a current digital input depends on a code segment of a previous digital input, the code segment of the current digital input, and transition rates of DAC cells (e.g., 1-bit DACs) included in a multi-bit DEM DAC. In addition, a setting of a start pointer for a code segment of a next digital input depends on the code segment of the current digital input, the code segment of the next digital input, and transition rates of DAC cells (e.g., 1-bit DACs) included in the multi-bit DEM DAC. In a case where the modified rotated PWM technique is employed by the PWM code rotator 404 included in the multi-bit DEM DAC 400 shown in FIG. 4, the PWM code rotator 404 is further arranged to maintain a transition rate array which records transition rate information of the 1-bit DACs 401_1-406_T. For example, the transition rate array may be kept in a storage space allocated in a memory device.

Figure 12:
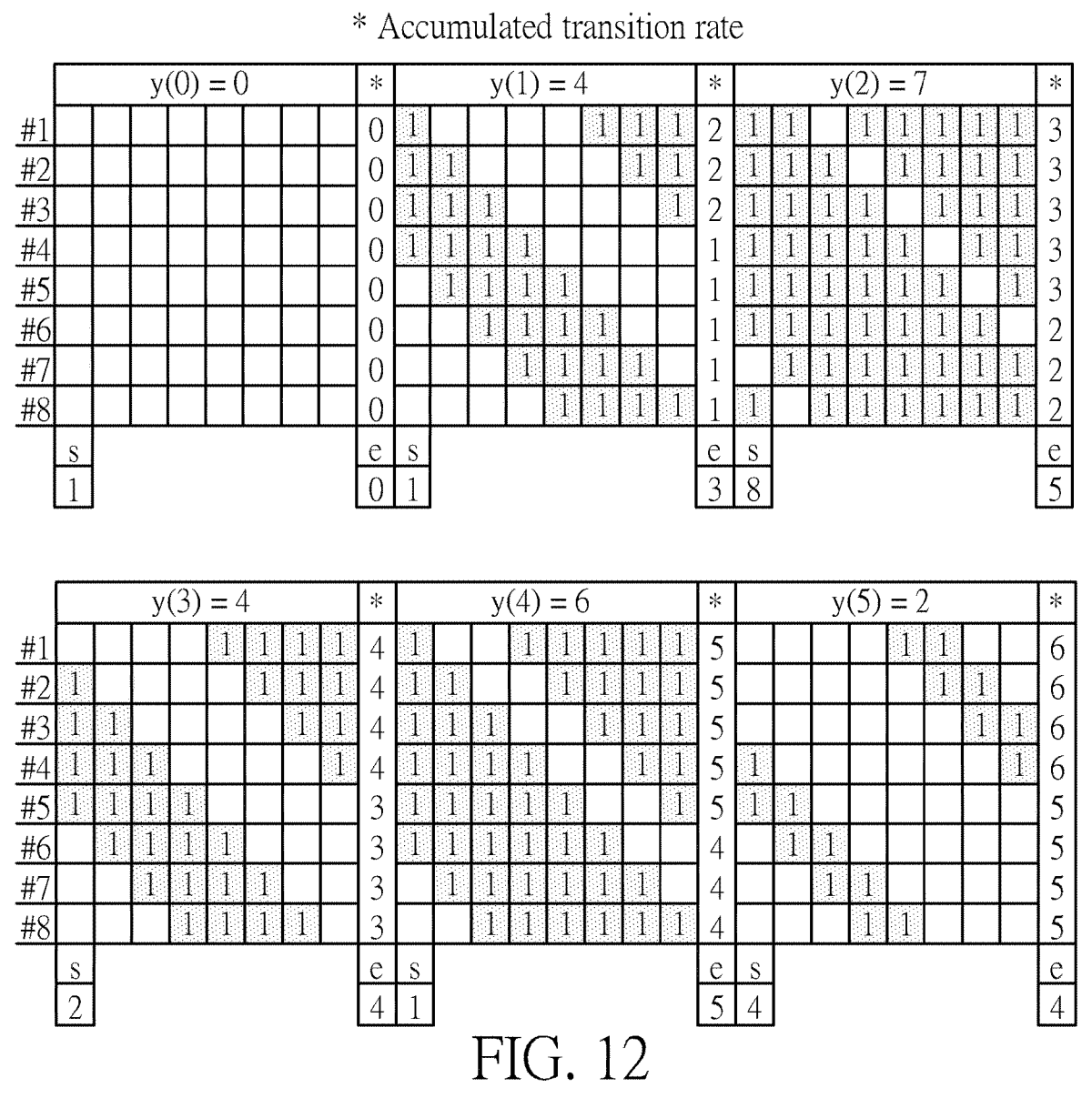

FIG. 12 is a diagram illustrating a second modified rotated PWM operation performed at the PWM code rotator 404 shown in FIG. 4 according to an embodiment of the present invention. Supposing that the input code y(n) has 3 bits (K=3), the multi-bit DEM DAC 400 has eight 1-bit DACs 406_1-406_T (T=2³) that are indexed by #1, #2, . . . , #8, respectively. As shown in FIG. 12, consecutive code values {0, 4, 7, 4, 6, 2} represented by the input codes y(n) are successively fed into the multi-bit DEM DAC 400, where n={0, 1, 2, 3, 4, 5}. In addition, there are $2^K$ phases (denoted by "1", "2", "3", "4", "5", "6", "7", and "8") in each sampling period Ts, where K=3 and $$Ts = \frac{1}{Fs}.$$

When the code value {0} represented by the input code y(0) is received by the multi-bit DEM DAC 400, a thermometer code generated from the thermometer encoder 402 includes eight 0's. The start pointer s is initially set by 1 (i.e., s=1). Since none of the 1-bit DACs 406_1-406_T is switched on, a transition rate array records {0, 0, 0, 0, 0, 0, 0, 0} at an end of the sampling period associated with the input code y(0). An edge index e is used to record a DAC index value of a 1-bit DAC having a recorded transition rate being an edge between different transition rates recorded in the transition rate array. Hence, the edge index e is set/updated on the basis of transition rates of 1-bit DACs 406_1-406_T. At the end of the sampling period associated with the input code y(0), the edge index e is set by "0" (i.e., e=0) due to the fact that all transition rates recorded in the transition rate array have the same value.

When the code value {4} represented by the input code y(1) is received by the multi-bit DEM DAC 400, a thermometer code generated from the thermometer encoder 402 includes four 1's and four 0's. The start pointer s is set by 1 (i.e., s=1) according to the previous input code y(0), the current input code y(1), and the current edge index e (e=0). During the sampling period associated with the input code y(1), the 1-bit DAC indexed by #1 has two (0→1) code transitions, the 1-bit DAC indexed by #2 has two (0→1) code transitions, the 1-bit DAC indexed by #3 has two (0→1) code transitions, the 1-bit DAC indexed by #4 has one (0→1) code transition, the 1-bit DAC indexed by #5 has one (0→1) code transition, the 1-bit DAC indexed by #6 has one (0→1) code transition, the 1-bit DAC indexed by #7 has one (0→1) code transition, and the 1-bit DAC indexed by #8 has one (0→1) code transition. At an end of the sampling period associated with the input code y(1), the transition rate array records {2, 2, 2, 1, 1, 1, 1, 1}, and the edge index e is updated to 3.

When the code value {7} represented by the input code y(2) is received by the multi-bit DEM DAC 400, a thermometer code generated from the thermometer encoder 402 includes seven 1's. The start pointer s is set by 8 (i.e., s=8) according to the previous input code y(1), the current input code y(2), and the current edge index e (e=3). During the sampling period associated with the input code y(2), the 1-bit DAC indexed by #1 has one (0→1) code transition, the 1-bit DAC indexed by #2 has one (0→1) code transition, the 1-bit DAC indexed by #3 has one (0→1) code transition, the 1-bit DAC indexed by #4 has two (0→1) code transitions, the 1-bit DAC indexed by #5 has two (0→1) code transitions, the 1-bit DAC indexed by #6 has one (0→1) code transition, the 1-bit DAC indexed by #7 has one (0→1) code transition, and the 1-bit DAC indexed by #8 has one (0→1) code transition. At an end of the sampling period associated with the input code y(2), the transition rate array records {3, 3, 3, 3, 3, 2, 2, 2}, and the edge index e is updated to 5.

When the code value {4} represented by the input code y(3) is received by the multi-bit DEM DAC 400, a thermometer code generated from the thermometer encoder 402 includes four 1's and four 0's. The start pointer s is set by 2 (i.e., s=2) according to the previous input code y(2), the current input code y(3), and the current edge index e (e=5). During the sampling period associated with the input code y(3), the 1-bit DAC indexed by #1 has one (0→1) code transition, the 1-bit DAC indexed by #2 has one (0→1) code transition, the 1-bit DAC indexed by #3 has one (0→1) code transition, the 1-bit DAC indexed by #4 has one (0→1) code transition, the 1-bit DAC indexed by #5 has no (0→1) code transition, the 1-bit DAC indexed by #6 has one (0→1) code transition, the 1-bit DAC indexed by #7 has one (0→1) code transition, and the 1-bit DAC indexed by #8 has one (0→1) code transition. At an end of the sampling period associated with the input code y(3), the transition rate array records {4, 4, 4, 4, 3, 3, 3, 3}, and the edge index e is updated to 4.

When the code value {6} represented by the input code y(4) is received by the multi-bit DEM DAC 400, a thermometer code generated from the thermometer encoder 402 includes six 1's and two 0's. The start pointer s is set by 1 (i.e., s=1) according to the previous input code y(3), the current input code y(4), and the current edge index e (e=4). During the sampling period associated with the input code y(4), the 1-bit DAC indexed by #1 has one (0→1) code transition, the 1-bit DAC indexed by #2 has one (0→1) code transition, the 1-bit DAC indexed by #3 has one (0→1) code transition, the 1-bit DAC indexed by #4 has one (0→1) code transition, the 1-bit DAC indexed by #5 has two (0→1) code transitions, the 1-bit DAC indexed by #6 has one (0→1) code transition, the 1-bit DAC indexed by #7 has one (0→1) code transition, and the 1-bit DAC indexed by #8 has one (0→1) code transition. At an end of the sampling period associated with the input code y(4), the transition rate array records {5, 5, 5, 5, 5, 4, 4, 4}, and the edge index e is updated to 5.

When the code value {2} represented by the input code y(5) is received by the multi-bit DEM DAC 400, a thermometer code generated from the thermometer encoder 402 includes two 1's and six 0's. The start pointer s is set by 4 (i.e., s=4) according to the previous input code y(4), the current input code y(5), and the current edge index e (e=5). During the sampling period associated with the input code y(5), the 1-bit DAC indexed by #1 has one (0→1) code transition, the 1-bit DAC indexed by #2 has one (0→1) code transition, the 1-bit DAC indexed by #3 has one (0→1) code transition, the 1-bit DAC indexed by #4 has one (0→1) code transition, the 1-bit DAC indexed by #5 has no (0→1) code transition, the 1-bit DAC indexed by #6 has one (0→1) code transition, the 1-bit DAC indexed by #7 has one (0→1) code transition, and the 1-bit DAC indexed by #8 has one (0→1) code transition. At an end of the sampling period associated with the input code y(5), the transition rate array records {6, 6, 6, 6, 5, 5, 5, 5}, and the edge index e is updated to 4.

Figure 13:
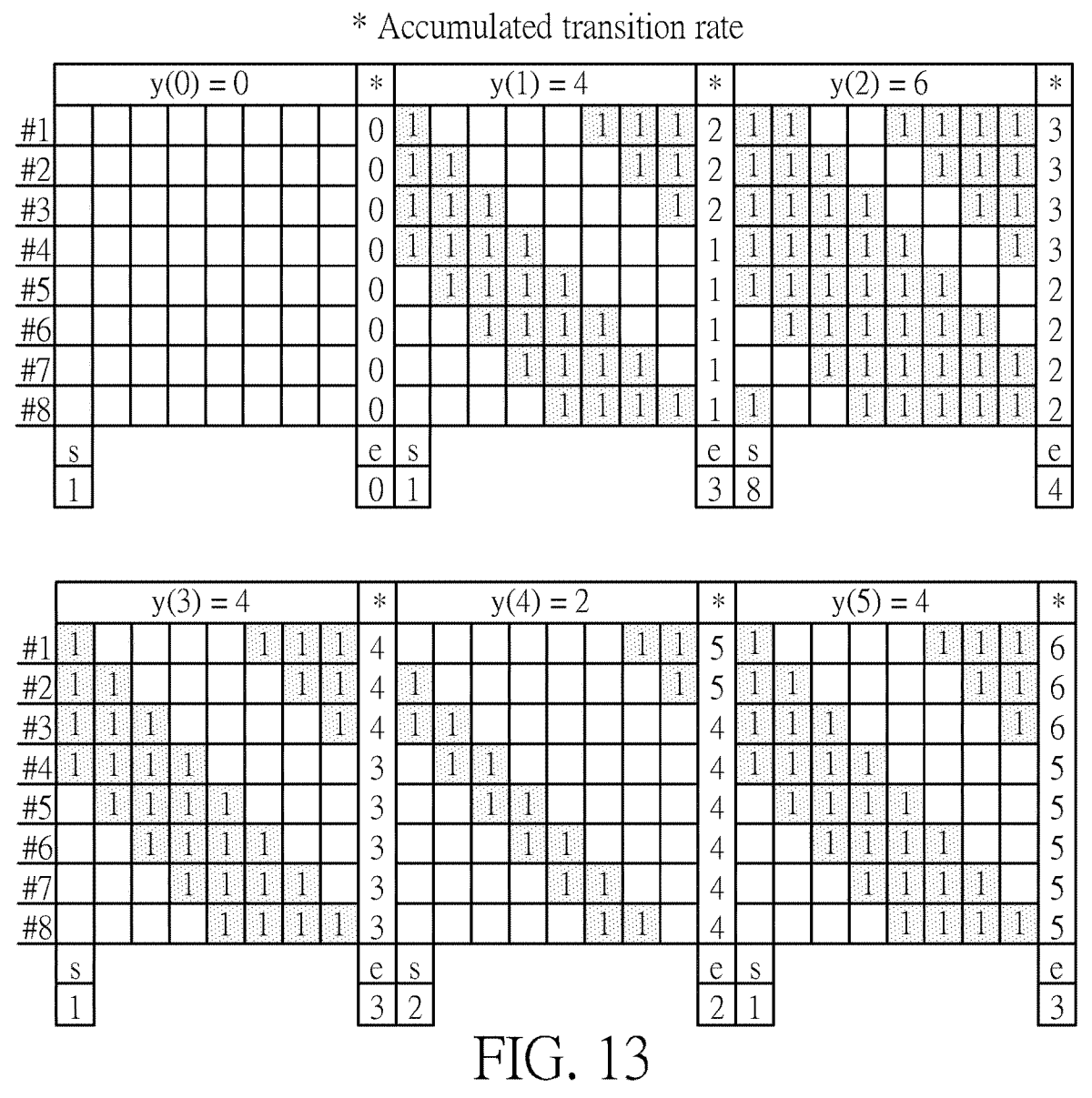

FIG. 13 is a diagram illustrating a third modified rotated PWM operation performed at the PWM code rotator 404 shown in FIG. 4 according to an embodiment of the present invention. As shown in FIG. 13, consecutive code values {0, 4, 6, 4, 2, 4} represented by the input codes y(n) are successively fed into the multi-bit DEM DAC 400, where n={0, 1, 2, 3, 4, 5}. Like the modified rotated PWM operation shown in FIG. 12, the modified rotated PWM operation shown in FIG. 13 adjusts the start pointer s adaptively.

Figure 14:
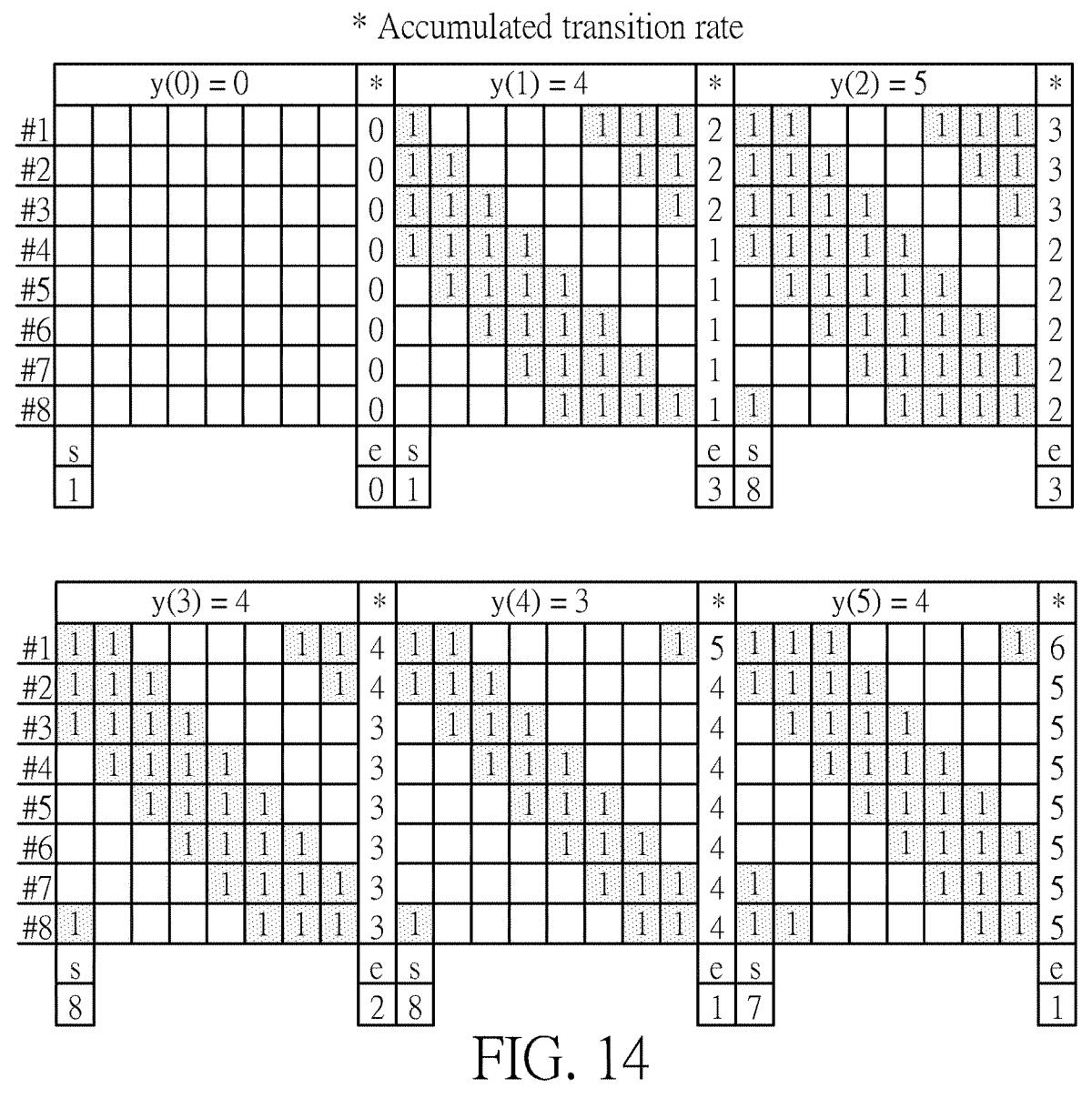

FIG. 14 is a diagram illustrating a fourth modified rotated PWM operation performed at the PWM code rotator 404 shown in FIG. 4 according to an embodiment of the present invention. As shown in FIG. 14, consecutive code values {0, 4, 5, 4, 3, 4} represented by the input codes y(n) are successively fed into the multi-bit DEM DAC 400, where n={0, 1, 2, 3, 4, 5}. Like the modified rotated PWM operation shown in FIG. 12, the modified rotated PWM operation shown in FIG. 14 adjusts the start pointer s adaptively.

As shown in FIGS. 12-14, there is no bubble code. Since there is no bubble code, the modified rotated PWM operation is free of non-constant ISI errors. Compared to the rotated PWM algorithm using a fixed start pointer, the modified rotated PWM algorithm has constant ISI errors under a condition that a fast change signal has a code change≠−1/0/+1.

In the examples shown in FIGS. 11-14, the PWM code rotator 404 is arranged to maintain a transition rate array which records accumulated transition rates of the 1-bit DACs 401_1-406_T. However, this is for illustrative purposes only, and is not meant to be a limitation of the present invention. Alternatively, the PWM code rotator 404 may be modified to subtract a same offset value from each transition rate and records adjusted transition rates in a transition rate array. In this way, the number of bits needed to record each transition rate in the transition rate array is reduced, thereby reducing the storage size of the transition rate array as well as the hardware cost. Taking the modified rotated PWM operation shown in FIG. 12 for example, the transition rate array may record {1, 1, 1, 0, 0, 0, 0, 0} at the end of the sampling period associated with the input code y(1), the transition rate array may record {1, 1, 1, 1, 0, 0, 0, 0} at the end of the sampling period associated with the input code y(2), the transition rate array may record {1, 1, 1, 0, 0, 0, 0, 0} at the end of the sampling period associated with the input code y(3), the transition rate array may record {1, 1, 0, 0, 0, 0, 0, 0} at the end of the sampling period associated with the input code y(4), and the transition rate array may record {1, 1, 1, 0, 0, 0, 0, 0} at the end of the sampling period associated with the input code y(5). The same objective of determining an edge index by referring transition rate information recorded in a transition rate array is achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital-to-analog conversion circuit for converting a first digital input into a first analog output, comprising:
   a segmentation circuit, arranged to apply segmentation to the first digital input to generate a plurality of code segments;
   a plurality of multi-bit dynamic element matching digital-to-analog converters (DEM DACs), arranged to convert the code segments into a plurality of DAC outputs, respectively, wherein the multi-bit DEM DACs comprise at least a first multi-bit DEM DAC and a second multi-bit DEM DAC, and the first multi-bit DEM DAC and the second multi-bit DEM DAC employ different DEM techniques; and
   a combination circuit, arranged to combine the DAC outputs to generate the first analog output.

2. The digital-to-analog conversion circuit of claim 1, wherein the first multi-bit DEM DAC employs a first DEM technique that uses a rotated pulse width modulation (PWM) algorithm.

3. The digital-to-analog conversion circuit of claim 2, wherein the segmentation circuit is a noise shaped segmentation circuit, the code segments comprise a first code segment that is associated with a most significant bit (MSB) part of the first digital input, the DAC outputs comprise a first DAC output, and the first multi-bit DEM DAC converts the first code segment into the first DAC output.

4. The digital-to-analog conversion circuit of claim 2, wherein the second multi-bit DEM DAC employs a second DEM technique, and complexity of the second DEM technique is lower than complexity of the first DEM technique.

5. The digital-to-analog conversion circuit of claim 4, wherein the second DEM technique uses a data weighted averaging (DWA) algorithm or a scrambling algorithm.

6. The digital-to-analog conversion circuit of claim 4, wherein the segmentation circuit is a noise shaped segmentation circuit, the code segments comprise a first code segment that is associated with a most significant bit (MSB) part of the first digital input and a second code segment that is associated with a least significant bit (LSB) part of the first digital input, the DAC outputs comprise a first DAC output and a second DAC output, the first multi-bit DEM DAC converts the first code segment into the first DAC output, and the second multi-bit DEM DAC converts the second code segment into the second DAC output.

7. The digital-to-analog conversion circuit of claim 3, wherein the first multi-bit DEM DAC comprises a plurality of DAC cells, and a first start pointer employed by the first multi-bit DEM DAC to apply the rotated PWM technique to the DAC cells for converting one code segment of the first digital input is not a fixed DAC index value.

8. The digital-to-analog conversion circuit of claim 7, wherein the digital-to-analog conversion circuit is further used for converting a second digital input into a second analog output, the first digital input and the second digital input are consecutive digital inputs fed into the digital-to-analog conversion circuit, a second start pointer is employed by the first multi-bit DEM DAC to apply the rotated PWM technique to the DAC cells for converting one code segment of the second digital input, and DAC index values set to the first start pointer and the second start pointer are not necessarily the same.

9. The digital-to-analog conversion circuit of claim 8, wherein a setting of the second start pointer depends on a code difference between said one code segment of the first digital input and said one code segment of the second digital input.

10. The digital-to-analog conversion circuit of claim 8, wherein a setting of the second start pointer depends on said one code segment of the first digital input, said one code segment of the second digital input, and transition rate information of the DAC cells.

11. A digital-to-analog conversion method for converting a first digital input into a first analog output, comprising:
applying segmentation to the first digital input to generate a plurality of code segments;
converting the code segments, by a plurality of multi-bit dynamic element matching digital-to-analog converters (DEM DACs), into a plurality of DAC outputs, respectively, wherein the multi-bit DEM DACs comprise at least a first multi-bit DEM DAC and a second multi-bit DEM DAC, and the first multi-bit DEM DAC and the second multi-bit DEM DAC employ different DEM techniques; and
combining the DAC outputs to generate the first analog output.

12. The digital-to-analog conversion method of claim 11, further comprising:
employing a first DEM technique in the first multi-bit DEM DAC, wherein the first DEM technique uses a rotated pulse width modulation (PWM) algorithm.

13. The digital-to-analog conversion method of claim 12, wherein the segmentation is a noise shaped segmentation, the code segments comprise a first code segment that is associated with a most significant bit (MSB) part of the first digital input, the DAC outputs comprise a first DAC output, and converting the code segments into the DAC outputs comprises:
converting, by the first multi-bit DEM DAC, the first code segment into the first DAC output.

14. The digital-to-analog conversion method of claim 12, further comprising:
employing a second DEM technique in the second multi-bit DEM DAC, wherein complexity of the second DEM technique is lower than complexity of the first DEM technique.

15. The digital-to-analog conversion method of claim 14, wherein the second DEM technique uses a data weighted averaging (DWA) algorithm or a scrambling algorithm.

16. The digital-to-analog conversion method of claim 14, wherein the segmentation is a noise shaped segmentation, the code segments comprise a first code segment that is associated with a most significant bit (MSB) part of the first digital input and a second code segment that is associated with a least significant bit (LSB) part of the first digital input, the DAC outputs comprise a first DAC output and a second DAC output, and converting the code segments into the DAC outputs comprises:
converting, by the first multi-bit DEM DAC, the first code segment into the first DAC output; and
converting, by the second multi-bit DEM DAC, the second code segment into the second DAC output.

17. The digital-to-analog conversion method of claim 13, wherein the first multi-bit DEM DAC comprises a plurality of DAC cells, and the digital-to-analog conversion method further comprises:
setting a first start pointer that is employed by the first multi-bit DEM DAC to apply the rotated PWM technique to the DAC cells for converting one code segment of the first digital input, wherein the first start pointer is not a fixed DAC index value.

18. The digital-to-analog conversion method of claim 17, wherein the digital-to-analog conversion method is further used for converting a second digital input into a second analog output, the first digital input and the second digital input are consecutive digital inputs of the digital-to-analog conversion method, and the digital-to-analog conversion method further comprises:
setting a second start pointer that is employed by the first multi-bit DEM DAC to apply the rotated PWM technique to the DAC cells for converting one code segment of the second digital input, wherein DAC index values set to the first start pointer and the second start pointer are not necessarily the same.

19. The digital-to-analog conversion method of claim 18, wherein a setting of the second start pointer depends on a code difference between said one code segment of the first digital input and said one code segment of the second digital input.

20. The digital-to-analog conversion method of claim 18, wherein a setting of the second start pointer depends on said one code segment of the first digital input, said one code segment of the second digital input, and transition rate information of the DAC cells.

* * * * *